United States Patent [19]

Johnson

[11] Patent Number: 4,677,742
[45] Date of Patent: * Jul. 7, 1987

[54] ELECTRONIC MATRIX ARRAYS AND METHOD FOR MAKING THE SAME

[75] Inventor: Robert R. Johnson, Franklin, Mich.

[73] Assignee: Energy Conversion Devices, Inc., Troy, Mich.

[*] Notice: The portion of the term of this patent subsequent to Oct. 8, 2002 has been disclaimed.

[21] Appl. No.: 558,216

[22] Filed: Dec. 5, 1983

Related U.S. Application Data

[63] Continuation-in-part of Ser. No. 458,919, Jan. 18, 1983, abandoned.

[51] Int. Cl.[4] .................... H01L 23/52; H01L 45/00
[52] U.S. Cl. .............................. 29/591; 148/DIG. 1; 357/2; 365/163
[58] Field of Search .................. 29/571, 572, 577 C, 29/591; 148/186, DIG. 1, DIG. 109; 357/2, 61, 68; 365/105, 113, 115, 163, 174, 175

[56] References Cited

U.S. PATENT DOCUMENTS

| | | | |
|---|---|---|---|
| 3,571,809 | 3/1971 | Nelson | 340/173 |
| 3,629,863 | 12/1971 | Neale | 340/173 |
| 3,699,543 | 10/1972 | Neale | 365/175 X |
| 3,875,566 | 4/1975 | Helbers | 365/163 |
| 3,877,049 | 4/1975 | Buckley | 357/2 |
| 3,886,577 | 5/1975 | Buckley | 357/2 |
| 4,001,871 | 1/1977 | Tsunemitsu | 29/577 R X |
| 4,281,208 | 7/1981 | Kuwano et al. | 29/572 X |
| 4,339,285 | 7/1982 | Pankove | 148/1.5 |
| 4,366,614 | 1/1983 | Kumurdjian | 29/580 |
| 4,481,524 | 11/1984 | Tsujide | 357/42 |
| 4,545,111 | 10/1985 | Johnson | 29/580 X |

FOREIGN PATENT DOCUMENTS 57-106083 7/1982 Japan .

Primary Examiner—Olik Chaudhuri
Attorney, Agent, or Firm—Marvin S. Siskind; Richard M. Goldman

[57] ABSTRACT

A method of making an electronic matrix array atop a non-conductive surface is disclosed. The method includes forming a first set of address lines on the non-conductive surface, depositing continuous layers of semiconductor materials atop the non-conductive surface and the first set of address lines to form a continuous selection means structure, and forming a second set of address lines over the selection means structure. In accordance with one preferred embodiment, the first set of address lines are formed by depositing a continuous layer of material which is convertible from an initially deposited non-conductive state to a conductive state responsive to the impingement of actinic radiation thereon and exposing selected portions of said convertible to actinic radiation.

16 Claims, 33 Drawing Figures

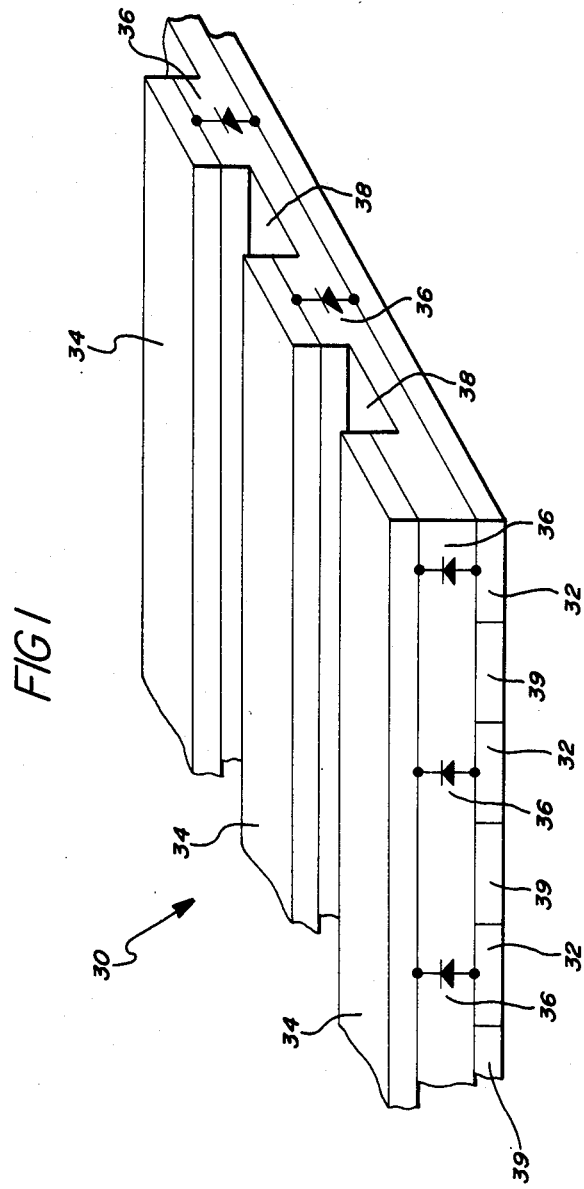

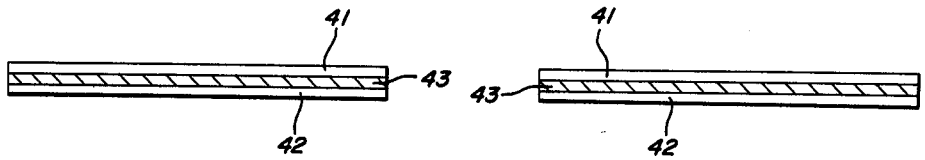
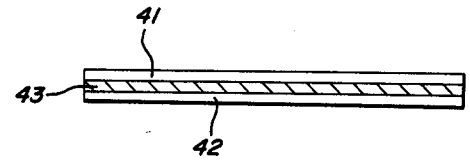
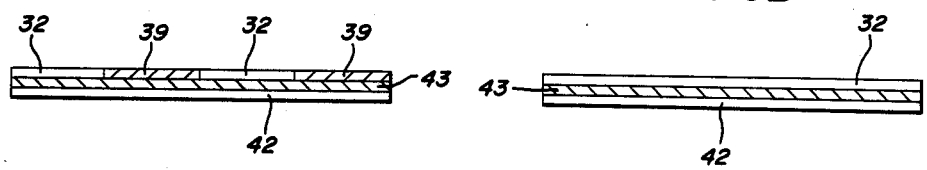
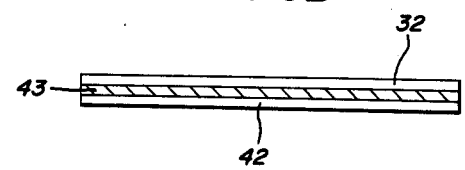
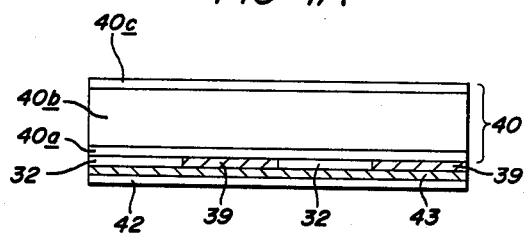
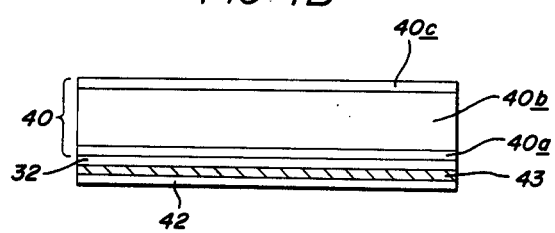
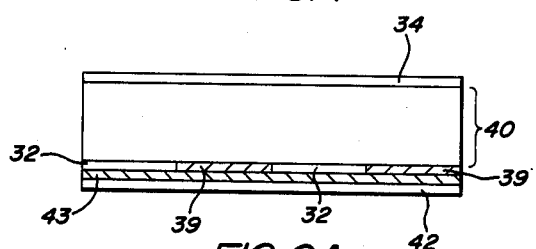
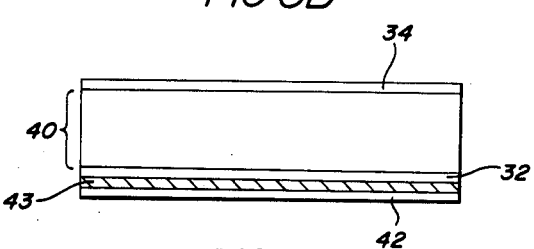
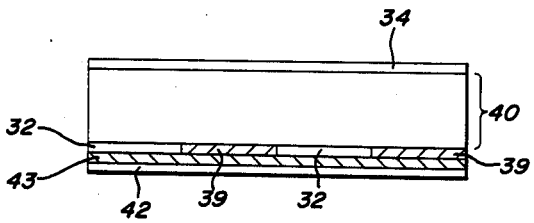
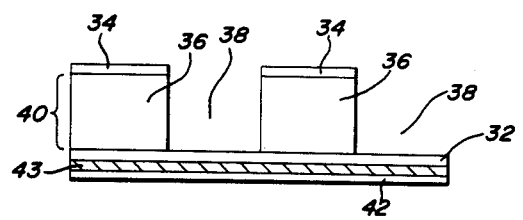
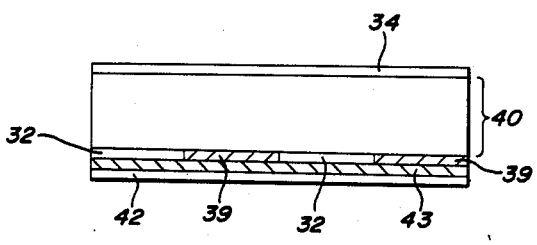
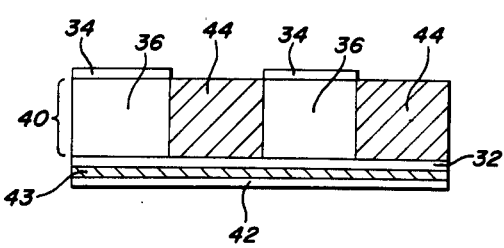

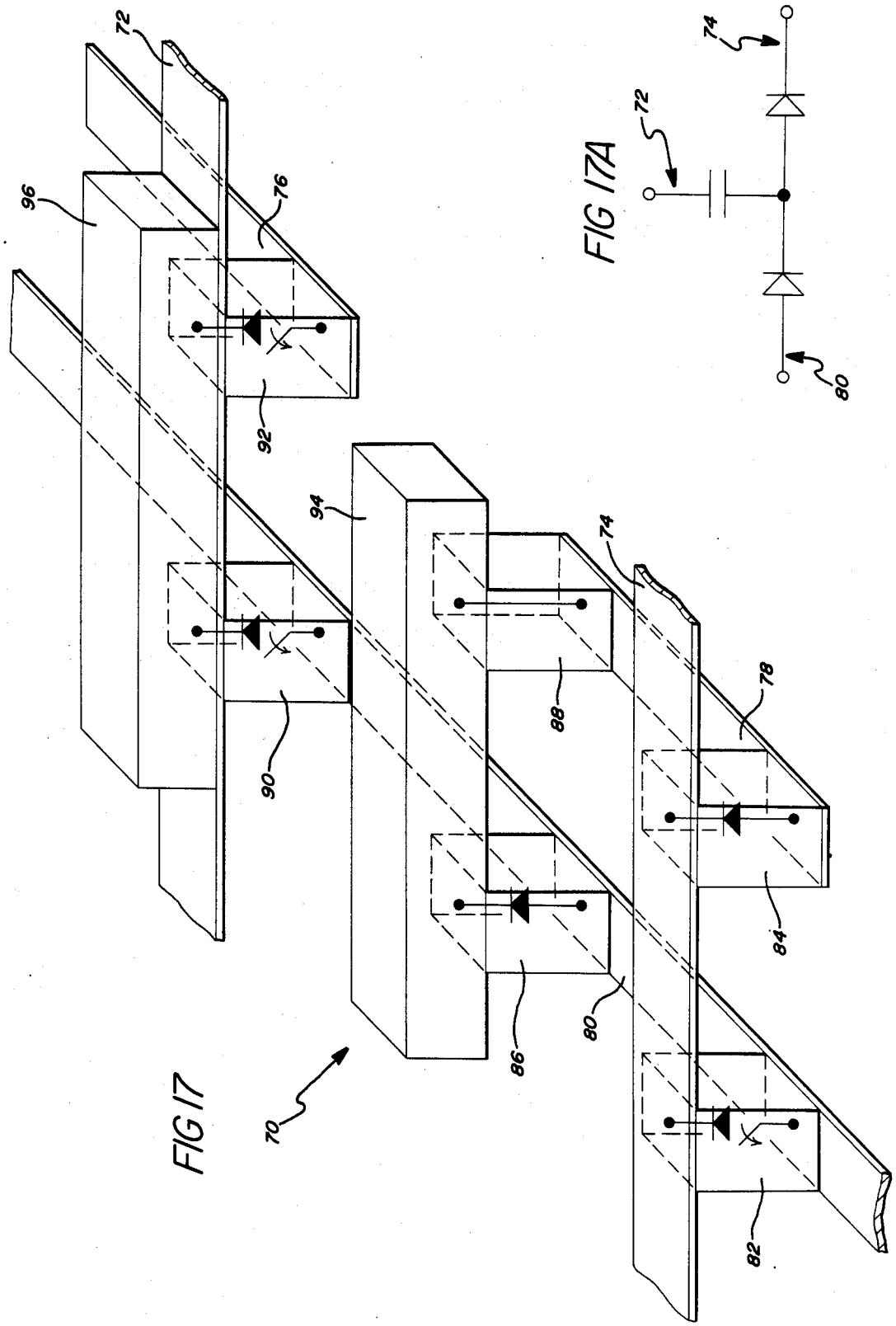

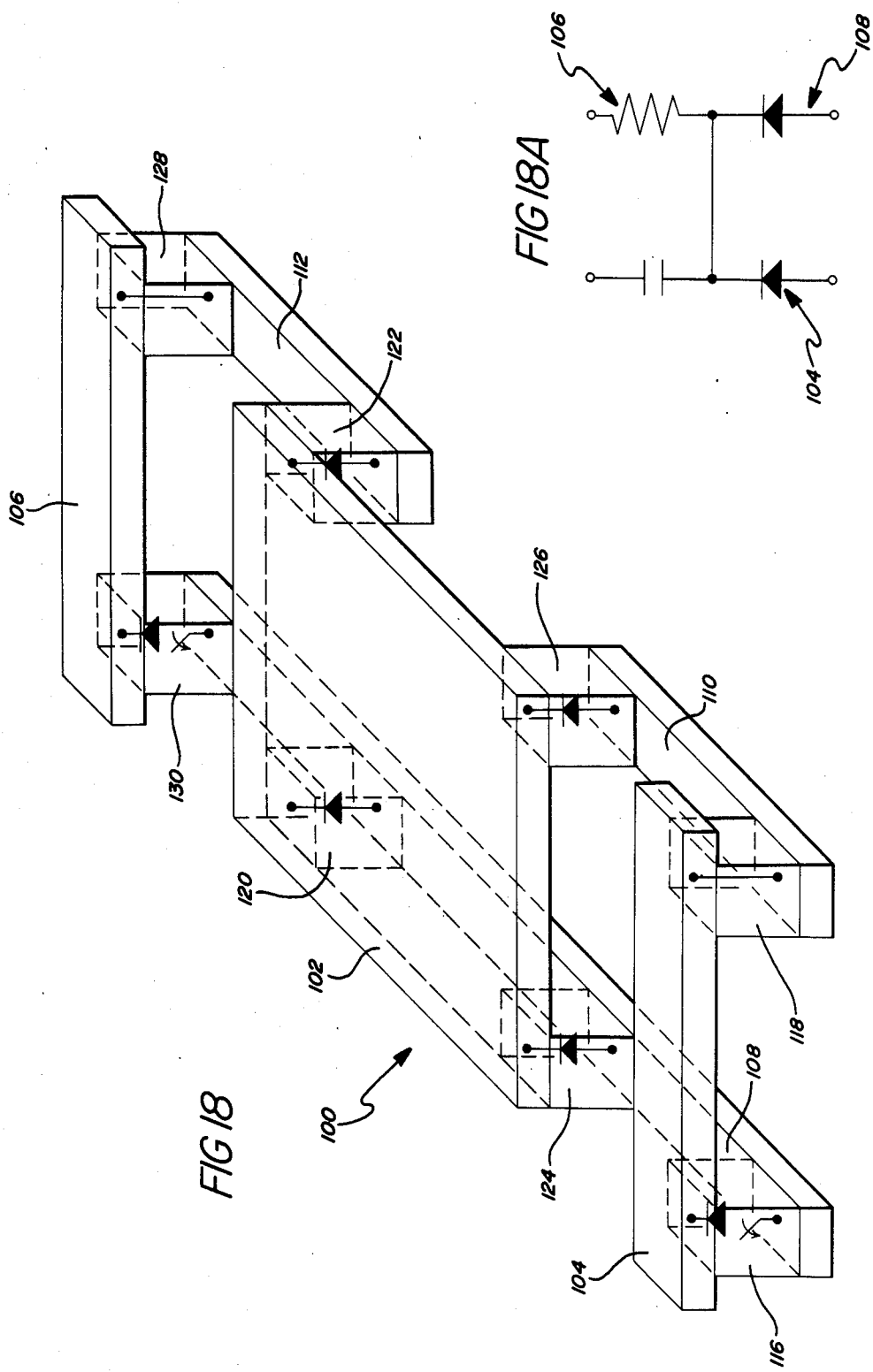

ELECTRONIC MATRIX ARRAYS AND METHOD FOR MAKING THE SAME

This is a continuation in part of U.S. application Ser. No. 458,919 filed Jan. 18, 1983, now abandoned.

BACKGROUND OF THE INVENTION

1. Field of the Invention

The present invention primarily relates to an electronic matrix array and more particularly to distributed arrays, especially deposited, distributed arrays, such as distributed transistor matrix arrays and distributed diode matrix arrays. The present invention further relates to improved read only memory (ROM) devices, electronically erasable programmable read only memory (EEPROM) devices, programmable read only memory (PROM) devices, field programmable logic arrays, and flat panel displays wherein the distributed diode matrix array facilitates isolation and addressing. The present invention allows such structures to be made with substantially greater packing densities than prior art arrays and with reduced processing steps and lithography control tolerances. Of great importance is the fact that these structures can be made in accordance with the present invention on substrates much larger than previously possible to provide substantially increased data storage, logic operations, or flat panel display areas. The diode matrix of the present invention is formed from amorphous alloys, including silicon, deposited onto large area substrates. To that end, reference can be made to the disclosure in U.S. Pat. No. 4,217,374 to Stanford R. Ovskinsky and Masatsugu Izu entitled: AMORPHOUS SEMICONDUCTORS EQUIVALENT TO CRYSTALLINE SEMICONDUCTORS and U.S. Pat. No. 4,226,898 Stanford R. Ovshinsky and Arun Madan, of the same title.

2. Description of the Prior Art

Silicon is the basis of the huge crystalline semiconductor industry and is the material which is utilized in substantially all the commercial integrated circuits now produced. When crystalline semiconductor technology reached a commercial state, it became the foundation of the present huge semiconductor device manufacturing industry. This was due to the ability of the scientist to grow substantially defect-free germanium and, particularly, silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either a p or n conduction type.

The semiconductor fabrication processes for making p-n junction crystals involve extremely complex, time consuming, and expensive procedures as well as high processing temperatures. Thus, these crystalline materials used in rectifying and other current control devices are produced under very carefully controlled conditions by growing individual single silicon or germanium crystals, and where p-n junctions are required, by doping such single crystals with extremely small and critical amounts of dopants. These crystal growing processes produce relatively small crystal wafers upon which the integrated memory circuits are formed.

In conventional crystalline integrated circuit technology the small area crystal wafer limits the overall size of the integrated circuits which can be formed thereon. In applications requiring large scale areas, such as the display technology, the crystal wafers cannot be manufactured with as large areas as required or desired. The devices are formed, at least in part, by diffusing p or n-type dopants into the substrate. Further, each device is formed between isolation channels which are diffused into the substrate and interconnected on each level of metalization by horizontally spaced conductors. Packing density (the number of devices per unit area of wafer surface) is thereby limited on the surface of the silicon wafers because conductors cannot be placed below the diffused junction areas. Costs are increased and yields decreased by the many lithographic steps required.

Further, the packing density is extremely important because the cell size is exponentially related to the cost of each device. For instance, a decrease in die size by a factor of two results in a decrease in cost on the order of a factor of six. A conventional crystalline ROM utilizing two micron lithography has a bipolar cell size of about 0.3 to 0.5 mil$^2$ or MOS cell size of about 0.2 to 0.3 mil$^2$.

In summary, crystal silicon rectifier and integrated circuit structures have to be spread horizontally across their crystalline wafer, they require many sequential processing and aligning steps, large amounts of material, high processing temperatures, are producible only on relatively small area wafers and are expensive and time consuming to produce. Devices based upon amorphous silicon can eliminate these crystal silicon disadvantages. Amorphous silicon can be made faster, easier, at lower temperatures and in larger areas than can crystal silicon and it can be deposited in layers on top of conductors as well as below conductors.

Accordingly, a considerable effort has been made to develop processes for readily depositing amorphous semiconductor alloys or films each of which can encompass relatively large areas, if desired, limited only by the size of the deposition equipment, and which could be doped to form p-type and n-type materials to form p-n junction rectifiers and devices superior in cost and/or operation to those produced by their crystalline counterparts. For many years such work was substantially unproductive. This was because amorphous silicon or germanium (Group IV) are normally four-fold coordinated and were found to have microvoids and dangling bonds and other defects with produced a high density of localized states in the energy gap thereof. The presence of a high density of localized states in the energy gap of amorphous silicon and germanium semiconductor films resulted in such films not being successfully doped or otherwise modified to shift the Fermi level close to the conduction or valence bands. The inability to shift the Fermi level made them unsuitable for making p-n junction rectifiers and other current control device applications.

In an attempt to minimize the aforementioned problems involved with amorphous silicon and germanium, W. E. Spear and P. G. Le Comber of Carnegie Laboratory of Physics, University of Dundee, in Dundee, Scotland did work on "Substitutional Doping of Amorphous Silicon", as reported in a paper published in Solid State Communications, Vol 17, pp. 1193-1196, 1975. Spear, et al's work was directed toward the end of reducing the localized states in the enrgy gap in amorphous silicon and germanium to make the same approximate more closely intrinsic crystalline silicon or germanium, and of substitutionally doping the amorphous materials and suitable classic dopants, as in doping crystalline materials, to make them extrinsic semiconductors, i.e., of p or n conduction types.

The reduction of the localized states was accomplished by glow discharge deposition of amorphous silicon films wherein a gas of silane ($SiH_4$) was passed through a reaction tube where the gas was decomposed by a r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane $B_2H_6$) for p-type conduction were premixed with the silane gas and passed through the glow discharge reaction tube under the same operating conditions. The gaseous concentration of the dopants used was between about $5\times10^{-6}$ and $10^{-2}$ parts per volume. The material so deposited included supposedly substitutional phosphorous or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition to substantially reduce the density of the localized states in the energy gap toward the end of making the electronic properties of the amorphous material approximate more nearly those of the corresponding crystalline material.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, to Stanford R. Ovshinsky and Arun Madan which issued Oct. 7, 1980, and by vapor deposition as fully described in U.S. Pat. No. 4,217,374, to Stanford R. Ovshinsky and Masatsugu Izu, which issued on Aug. 12, 1980, under the same title. As disclosed in these patents, fluorine is introduced into the amorphous silicon semiconductor alloy to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine also combines in a preferable manner with silicon and hydrogen, utilizing the hydrogen in a more desirable manner, since hydrogen has several bonding options. Without fluorine, hydrogen may not bond in a desirable manner in the material, causing extra defect states in the band gap as well as in the material itself. Therefore, fluorine is considered to be a more efficient compensating or altering element than hydrogen when employed alone or with hydrogen because of its high reactivity, specificity in chemical bonding, and high electro-negativity.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the alloy so formed has a lower density of defect states in the energy gap than that achieved by the mere neutralization of dangling bonds and similar defect states.

Heretofore various semiconductor materials, both crystalline and amorphous, have been proposed for utilization in rectifying type devices such as a diode. As is described in my commonly assigned, copending U.S. application Ser. No. 458,919, and as will be described in greater detail hereinafter, the distributed diode array of the present invention is formed from amorphous alloys including silicon as for example disclosed in the applications identified above. The distributed diode array of the present invention can be utilized in the ROM, EEPROM and PROM devices of the present invention as well as in the field programmable arrays and flat panel displays of the present invention.

Heretofore various memory systems have been proposed which are divided into several types. One type is the serial type where the information in the memory system is obtained serially and where the read time for reading a particular bit of information in the memory is dependent upon where it is located in the memory. This results in long read times for obtaining the information from memory. Such types of memory systems include memory devices including a magnetic tape or a magnetic disc including the so-called floppy disc and magnetic "bubble memory" devices. While the storage information in "bubble" type memory devices potentially reduces the size and cost of memory systems and provides high information packing densities, i.e., small center-to-center distance between adjacent memory regions where the bits of information are stored, such "bubble" systems are limited to serial reading of information and do not provide for fast read, random access to the stored information.

Also, heretofore, short term data storage has been provided by random access memory (RAM) devices including transistors or capacitors at the intersections of X and Y axis conductors. Such a memory device can be set in one of two operational states. These memory devices provide a fairly high packing density, i.e., a small center-to-center distance between memory locations. A major disadvantage is that such devices are volatile since they must be continually supplied with a voltage if they are to retain their stored data. Such short term data storage devices are often referred to as volatile fast read and write memory systems.

A fast read non-volatile memory system is the read only memory (ROM) which uses transistors and rectifiers formed in semiconductor substrates with permanently open contact points or permanently closed contact points in an x-y array for storage of bits of information. Such a ROM system is typically mask-programmed during the manufacture thereof and has a fast read time and a relatively high packing density as well as being non-volatile. However, the obvious disadvantage of such a ROM system is that the data stored cannot be altered and has to be built in at the factory. Accordingly, ROM devices are made-to-order for applications involving storing of the basic operating program of a data processor or other non-altered information.

Another memory system used is a programmable read only memory (PROM) system which can be programmed once by the user and remains in that state. Once it is programmed a PROM system will operate identically to a ROM system of the same configuration.

The most commonly used PROM system incorporates fuse links positioned at each intersection of an X-Y matrix of conductors. The storage of information (logic one or logic zero) is obtained by blowing the fuse links in a given predetermined pattern. Such fuse links extend laterally on a single crystal substrate instead of vertically between crossover conductors and, as a result, such fuse links necessarily require a large area. The area of a typical memory cell or region utilizing a fuse link is about 1 to 1.6 mil$^2$.

The current needed to blow the fuse link for programming is quite high because of the necessity of completely blowing out the fuse link and because of the inherently high conductivity of the material of the fuse link. Typical currents are 50 milliamps and the power required is approximately 250 to 400 milliwatts. Also, the fuse link which is a narrow portion of a conductor deposited on a substrate, must have a precise dimension to ensure the complete and programmable blow out thereof. In this respect, photolitography and etching techniques required to fabricate such a fuse link require that such a fuse link be made with very critical tolerances.

Another major problem with fuse link type PROM devices is that the small gap in the blown fuse can become closed with accumulation of conductive material remaining adjacent to the gap by diffusion or otherwise.

The fuse link technology also has been utilized in field programmable logic arrays, redundant memory arrays, gate arrays and die interconnect arrays. Field programmable logic arrays are utilized to provide options for the integrated circuit user between the standard high volume, low cost logic arrays and the very expensive handcrafted custom designed integrated circuits. These arrays allow a user to program the low cost array for the users specific application at a substantially reduced cost from the cost of a custom application circuit.

Heretofore it has also been proposed to provide an EEPROM (electrically erasable programmable read only memory) device, a vertically disposed memory region or cell in a memory circuit which is vertically coupled at and between an upper Y axis conductor and a lower X axis conductor in a memory matrix. Such an EEPROM system provides a relatively high packing density. Examples of such EEPROM's are disclosed in the following patents:

| U.S. Pat. No. | PATENTEE |
|---|---|
| 3,571,809 | Nelson |
| 3,573,757 | Adams |
| 3,629,863 | Neale |
| 3,699,543 | Neale |
| 3,846,767 | Cohen |
| 3,886,577 | Buckley |
| 3,875,566 | Helbers |
| 3,877,049 | Buckley |
| 3,922,648 | Buckley |
| 3,980,505 | Buckley |
| 4,177,475 | Holmberg |

Specific reference is made to the U.S. Pat. No. 3,699,543 to Neale directed to: COMBINATION FILM DEPOSITED SWITCH UNIT AND INTEGRATED CIRCUIT and to U.S. Pat. No. 4,177,475 to Holmberg directed to: HIGH TEMPERATURE AMORPHOUS MEMORY DEVICE FOR AN ELECTRICALLY ALTERABLE READ ONLY MEMORY.

These references illustrate EEPROM devices including a matrix of X and Y axis conductors where a memory circuit, including a memory region and an isolating device is located at each crossover point and extends generally perpendicularly to the crossover conductors thereby to provide a relatively high packing density.

The memory region utilized in such EEPROM devices have typically been formed of a tellurium-based chalcogenide material and more specifically an amorphous material such as amorphous germanium and tellurium. Other materials which have rather highly reversible memory regions include a $Ge_aTe_b$ wherein a is between 5 and 70 atomic percent and b is between 30 and 95 atomic percent, based on total germanium and tellurium. Some of these materials also include other elements in various percentages from 0 to 40 in atomic percent such as antimony, bismuth, arsenic, sulfur and/or selenium.

Heretofore it has also been known to provide isolating devices which are coupled in series with a memory region or cell at the intersections of orthogonal conductors, such isolating devices typically having been formed by diffusing various dopant materials into a single crystal silicon substrate to form a rectifier, transistor, or MOS device, e.g., a field effect transistor. Such a diffusion process requires horizontally spaced x-y conductors and results in lateral diffusion of the doped material into the substrate material. As a result, the cell packing densities of such prior memory systems have been limited by the number of horizontal metal lines and by the degree of lateral diffusion of the dopant materials and by the margin of error required for mask alignment.

Heretofore an all thin film EEPROM device has been proposed and is disclosed in U.S. Pat. No. 3,629,863, referred to above. The all thin film memory circuit disclosed in U.S. Pat. No. 3,629,863 utilized deposited film bidirectional threshold type isolating devices.

The devices herein utilized for each isolating device a diode which is a unidirectional isolating device and which provides isolation by a high impedance p-i-n configuration in one direction to current flow thereby to provide very high OFF resistance.

It has been proposed to form a p-n junction by vacuum depositing, either an n or p-type amorphous semiconductor film on an oppositely doped silicon chip substrate. In this respect, reference is made to U.S. Pat. No. 4,062,034 which discloses such a thin film transistor having a p-n junction. However, it has not been previously proposed to use a thin film deposited amorphous semiconductor film for forming p-i-n isolating devices in a programmable array.

SUMMARY OF THE INVENTION

The invention provides an electronic matrix array deposited atop a substrate, and comprising a plurality of first spaced apart address lines deposited on a non-conductive surface of the substrate and a plurality of second spaced apart address lines. The second address lines cross at an angle and are spaced from the first address lines to form a plurality of crossover points therewith. The array further includes selection means between each of the crossover points for establishing selectable current paths through respective pairs of the first and second address lines. Each selection means includes a body of semiconductor material between the first and second address lines at the crossover points and has an effective current conducting cross-sectional area no larger than that formed by the overlapping juxtaposed common surface area of the address lines.

The invention also provides a method of making an electronic matrix array including the steps of depositing first, spaced apart address lines atop a non-conductive surface of a substrate, depositing semiconductor materials atop the first address lines and substrate to form a continuous selection means structure over the first address lines and substrate, and thereafter forming a plurality of second spaced apart conductive address lines on the continuous selection means structure on the side thereof opposite the first address lines and substrate, the second spaced apart address lines crossing at an angle from said first address lines to form a plurality of isolated crossover points therewith.

In an alternate approach to providing the isolation, the electrical conductivity of the continuous diode structure can be modified in selected areas thereof between the plurality of first address lines and between the second address lines to form a plurality of electrically isolated selection devices at said crossover points between the plurality of first and second address lines. To effect this isolation the electrical conductivity of the selection means structure is preferably modified by oxidizing the selection means structure semiconductor material in the selected areas or by removing portions of the selection means structure semiconductor material in the selected area. For smaller arrays, the lateral electrical conductivity of the thin amorphous silicon film is sufficiently small that nothing needs to be done to improve the isolation between crossovers.

The semiconductor bodies of the selection means preferably form diode means formed from amorphous silicon alloys and include an intrinsic region and a pair of doped regions on opposite respective sides of the intrinsic region between the intrinsic region and the first and second address lines.

To form a ROM, a PROM or field programmable array, a layer of settable material having a normal substantially non-conductive state and a settable substantially non-resettable comparatively high conductive state can be included between the selection means and one of the plurality of address lines. The settable material preferably comprises either an intrinsic amorphous silicon alloy or a chalcogenide material.

To form an EEPROM array, a layer of resettable material having a substantially non-conductive state and a comparatively high conductive state can be included between the selection means and one of the plurality of address lines wherein the resettable material is settable and resettable between those states. The resettable material preferably includes a chalcogenide.

A flat panel display can also be formed by providing a layer of liquid crystal material over the diode means and utilizing selected address lines as electrodes to apply an electric field across the liquid crystal material.

A light sensing array can also be formed by forming one plurality of address lines from a transparent conductor, such as indium tin oxide and utilizing the photoconductive properties of the amorphous silicon layer that forms the diodes in the crossovers.

BRIEF DESCRIPTION OF THE DRAWINGS

FIG. 1 is a partial perspective view of an electronic matrix array embodying the present invention;

FIGS. 2A through 6A are partial side views illustrating various stages of fabrication of the matrix array of FIG. 1 in accordance with the present invention;

FIGS. 2B through 6B are partial side views of the matrix array of FIG. 1 at the various stages of the fabrication thereof as viewed from a frame of reference perpendicular to the corresponding views of FIGS. 2A through 5A respectively;

FIGS. 7A and 7B are partial side views similar to FIGS. 6A and 6B respectively which illustrate an alternative method of isolating the diodes of the matrix array;

FIGS. 9A through 12A are partial side view illustrating various states of fabrication of the electronic array of FIG. 8 in accordance with the present invention;

FIGS. 9B through 12B are partial side views of the electronic matrix array of FIG. 8 at the various stages of the fabrication thereof as viewed from a frame of reference perpendicular to the corresponding views of FIGS. 9A through 12A respectively;

FIGS. 14A through 16A are partial side views illustrating various stages of fabrication of the electronic array of FIG. 13;

FIGS. 14B through 16B are partial side views of the electronic matrix array of FIG. 13 at the various stages of the fabrication thereof as viewed from a frame of reference perpendicular to the corresponding views of FIGS. 14A through 16A respectively;

FIG. 17 is a partial perspective view of a flat panel display embodying the present invention;

FIG. 17A is a schematic diagram of the equivalent circuit of the flat panel display of FIG. 17;

FIG. 18 is a partial perspective view of another flat panel display embodying the present invention; and FIG. 18A is a schematic diagram of the equivalent circuit of the flat panel display of FIG. 18A.

DESCRIPTION OF THE PREFERRED EMBODIMENTS

Figure 8:
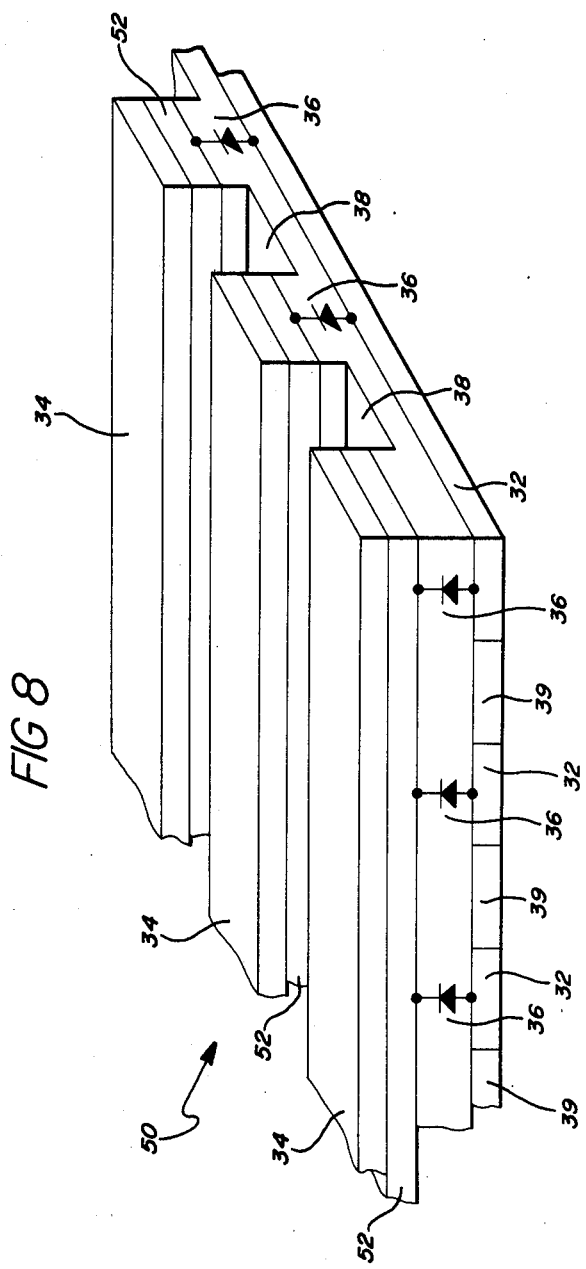
FIG. 8 is a partial perspective view of another electronic matrix array embodying the present invention.

Referring now to FIG. 1, there is shown an electronic matrix array 30 embodying the present invention. The array 30 generally includes a first plurality of conductive address lines 32, a second plurality of address lines 34, and a plurality of selection devices in the form of diodes 36 between the address lines 32 and 34. The first and second plurality of address lines cross at an angle and are spaced apart by the diodes 36 to form a plurality of crossover points. As illustrated, the first and second address lines are orthogonally related and cross at an angle of 90°. As can also be seen in the figure, the address lines are formed from parallel spaced apart bands of conductive material such as platinum or aluminum. Between each crossover point there is a diode 36. The diodes include a body of semiconductor materials and preferably are formed from amorphous silicon alloys in accordance with the present invention. More particularly, and as will be further described with respect to FIGS. 2 through 5, the diodes preferably comprise amorphous silicon alloys forming a p-i-n diode configuration.

The selection devices or diodes 36, as illustrated, are separated by orthogonally related grooves or channels 38, or by non-conducting regions 39. As will be described subsequently, the grooves or channels 38 are formed by etching the amorphous silicon alloys in the areas left exposed by address lines 34. While the non-conducting regions 39 are formed prior to or subsequent to the formation of the address lines 32, e.g. by enhancing the conductivity of the regions of the intended address lines 32, or reducing the conductivity of the intended non-conducting regions 39, or both. This aids in providing electrical isolation between the diodes. However, because the lateral conductivity of the amorphous silicon is relatively low, such channels, grooves or regions may not be necessary for all applications. However, in view of the fact that the address lines 32 and 34 crossover with the diodes in between, either due to the limited lateral conductivity of the amorphous silicon alloys or the physical separation of the diodes by the channels or grooves 38, or the regions 39, the diodes have an effective current conduction cross-sectional area formed by the overlapping juxtaposed common substrate area of the address lines.

FIGS. 2A through 5A, and 2B through 5B illustrate the fabrication process of the diode matrix array of FIG. 1.

As can be seen in FIGS. 2A and 2B, a film of a conductive material 41 is deposited atop an insulating or non-conducting film 43 on the conductive substrate 42. The insulating or non-conducting film 43 electrically isolates the substrate 42, e.g., a conducting substrate, from the address lines 32 and provides a smooth surface for the diode structure. The non-conducting film 43 may be an organic polymer or an inorganic material, and it may be a dielectric insulator. Typically, the conductive material 41 may be aluminum or a deposited amorphous semiconductor having a high population of majority charge carriers, or even a high concentration of conductivity enhancing additives. As shown in FIGS. 3A and 3B, interleaved regions of relatively high conductivity material and relatively low conductivity material are formed in the film, whereby to form first address lines 32 and non-conductor regions 39, i.e., regions of dielectric, non-conductor, or semiconductor.

When film 41 deposited atop insulator film 43 is conductive, as aluminum or a deposited amorphous semiconductor having a high population of majority charge carriers, regions of low conductivity material or even of non-conducting material may be formed by masking of the intended conducting regions 32 and oxidation of the intended non-conducting region 39, e.g., to form interleaved regions of aluminum 32 and of aluminum oxide 39, or interleaved regions of deposited amorphous silicon having a high population of majority charge carriers or conductivity enhancing additives 32 and of silicon dioxide 39.

When film 41 deposited atop insulator film 43 is semiconductive or non-conductive, as a deposited amorphous intrinsic semiconductor, regions of high conductivity 32 may be formed therein, interleaved between regions of low conductivity 39 by increasing the electrical conductivity of the intended regions of high conductivity 32, e.g. by the introduction of high populations of majority charge carrier therein, or even by the introduction of additives, such as aluminum, that render regions of the amorphous material conductive.

Alternatively, film 41 may be formed of a material that is substantially settable and non-resettable between high and low conductivity states. The film 41 may be set into regions of relatively high conductivity 32 and relatively low conductivity 39, e.g. by coherent actinic radiation.

According to a still further exemplification, a non-conducting film 43 can be converted into regions of relatively high conductivity 32 and relatively low conductivity 39 by diffusing a conductor or conductive material into the film 43. For example, aluminum vapor can be diffused into an amorphous silicon film 43 through a patterned mask whereby to form a pattern of conductive channels 32 in and interleaved between the non-conductive material 39. Thus, approximately ten atomic percent aluminum vapor diffused into amorphous silicon provides channels of metallic conductivity.

According to a still further exemplification, the address lines may be deposited directly onto the non-conductive film 43, or a non-conductive substrate 42, or the address lines may be diffused directly into the non-conductive film 43 or the non-conductive substrate 42, whereby to avoid the application of the film 41. The deposition or diffusion may be carried out through mask means, focused or programmed actinic radiation.

While the pattern of interleaved address lines 32 of relatively high conductivity and insulating or non-conducting regions of relatively low conductivity 39 is shown as being deposited on an insulating film 43 on the substrate 42, the substrate 42 itself can be an insulator, e.g. an organic polymer. When the substrate 42 is an insulator, the insulating film 43 may be dispensed with and the addressing means 32 deposited directly on the substrate 42.

The addressing lines 32 can be formed on the non-conducting film 43, or directly on a non-conducting substrate 42, without the adjacent non-conducting regions 39. When the non-conducting regions 39 are dispensed with, either a non-conducting film 43, or the amorphous semiconductor material of the distributed diode 40 can provide horizontal separation and isolation between adjacent address lines 32.

As can be seen in FIGS. 4A and 4B, an amorphous silicon alloy p-i-n selection or diode structure 40 is thereafter formed atop the first address lines 32 and non-conductors 39. The selection means structure 40 preferably comprises a diode structure formed by a p-type amorphous silicon alloy region 40a an intrinsic amorphous silicon alloy region 40b, and an n-type amorphous silicon alloy region 40c.

Amorphous silicon alloys can be deposited in multiple layers over large area substrates to form such structures in high volume, continuous processing systems. Continuous processing systems of this kind are disclosed, for example, in pending patent applications: Ser. No. 151,301, filed May 19, 1980 for A Method Of Making P-Doped Silicon Films And Devices Made Therefrom now U.S. Pat. No. 4,542,711; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System now U.S. Pat. No. 4,410,558; Ser. No. 306,146, filed Sept. 28, 1981 for Multiple Chamber Deposition And Isolation System And Method; and Ser. No. 359,825, filed Mar. 19, 1982 for Method and Apparatus For Continuously Producing Tandem Amorphous Photovoltaic Cells now U.S.

Pat. No. 4,492,181. As disclosed in these applications, which are incorporated herein by reference, a substrate formed from stainless steel, for example, may be continuously advanced through a succession of deposition chambers, wherein each chamber is dedicated to the deposition of a specific material.

In making a p-i-n type configuration, a single deposition chamber system can be used for batch processing or preferably, a multiple chamber system can be used wherein a first chamber is used for depositing a p-type amorphous silicon alloy, a second chamber is used for depositing an intrinsic amorphous silicon alloy, and a third chamber is used for depositing an n-type amorphous silicon alloy. Since each deposited alloy, and especially the intrinsic alloy must be of high purity, the deposition environment in the intrinsic deposition chamber is preferably isolated from undesirable doping constituents within the other chambers to prevent the diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

In the previously mentioned patent applications, deposition of the amorphous silicon alloy materials onto the large area continuous substrate is accomplished by glow discharge decomposition of the process gases. Among these processes, radio frequency energy glow discharge processes have been found suitable for the continuous production of amorphous semiconductors, the first use of which has been as photovoltaic devices. Also, a new and improved process for making amorphous semiconductor alloys and devices has recently been discovered. This process is disclosed in copending application Ser. No. 423,424, filed Sept. 24, 1982 for Method Of Making Amorphous Semiconductor Alloys And Devices Using Microwave Energy, now U.S. Pat. No. 4,517,223. This process utilizes microwave energy to decompose the reaction gases to cause the deposition of improved amorphous semiconductor materials. This process provides substantially increased deposition rates and reaction gas feed stock utilization. Microwave glow discharge processes can also be utilized in high volume mass production of devices as disclosed in copending application Ser. No. 441,280, filed Nov. 12, 1982, for An Improved Apparatus For The Manufacture Of Photovoltaic Devices now U.S. Pat. No. 4,515,107 and to make layered structures as also disclosed in copending application Ser. No. 435,068, filed Oct. 18, 1982, for Method And Apparatus For Making Layered Amorphous Semiconductor Alloys Using Microwave Energy now abandoned.

As shown in FIGS. 5A and 5B, after the p-i-n amorphous silicon alloy structure 40 is formed atop the first address lines 32 and non-conductors 39, the top layer of conductive material from which will be formed the second plurality of address lines 34 is formed on the selection means or diode structure 40. The lines 34 can be formed in parallel bands, for example, by conventional photolithography techniques of the type well known in the art.

The resulting structure shown in FIGS. 5A and 5B represents a useful device in and of itself for many applications. This is due to the limited lateral conductivity of the amorphous silicon alloys comprising the diode structure.

Should further electrical isolation be desired, such isolation can be obtained as shown in FIGS. 6A and 6B. In FIGS. 6A and 6B, the amorphous silicon diode structure 40 is etched to form the channels or grooves 38 in the areas thereof left exposed by the address lines 34. As a result, the address lines 34 can be used as a mask during the etching operation. The amorphous silicon alloy diode structure 40 need not be etched all the way through. In many cases, only the doped p and n-type regions need be etched through because these regions are of higher conductivity than the intrinsic region.

Although not illustrated, a potting compound can be introduced into the grooves or channels 38 after the etching process. This can be done to provide increased structural integrity for the finished device. Alternatively, the diode structure can be attached to another non-conductive substrate to provide increased structural integrity.

As an alternative to the etching operation illustrated in FIGS. 6A and 6B, the additional electrical isolation between the diodes 36 can also be provided by oxidizing the amorphous silicon alloy diode structure in the selected areas left exposed by the address lines 34, as illustrated in FIGS. 7A and 7B. This can be accomplished by using the address lines as a mask and by either implanting oxygen into the selected areas of the amorphous silicon alloys or by exposing the entire structure to a high temperature oxidizing atmosphere. The resulting device will then include oxidized regions 44 in the selected areas. Whether the etching or oxidizing process is employed to provide the additional electrical isolation between the diodes, the electrical conductivity of the diode structure in the selected areas will be modified by being decreased to thereby increase the electrical isolation between the diodes 36.

Not only can the distributed electronic diode matrix array be formed over large area substrates, but the packing density thereof is greatly increased by the present invention over prior art structures regardless of the lithography feature size used. This results because only two lithography steps are necessary in fabricating the diode matrix, one being in forming the second set of address lines 34. Thereafter, the second set of address lines 34 themselves can be used as masks for further processing. Also, the selection or diode structure 40 can be formed from polycrystalline material. This can be accomplished by annealing the selection means structure 40 prior to forming the first plurality of address lines at a temperature which converts the amorphous silicon alloys to polycrystalline silicon alloys. For example, if the selection structure initially comprises amorphous silicon-hydrogen alloys, it can be annealed at 650° C. for an hour to convert the same to polycrystalline material. If it is initially formed from an amorphous silicon-fluorine alloy, it can be annealed at 550° C. for an hour. This can also be done for any of the embodiments to be described hereinafter.

Further, if the first plurality of address lines are formed from a transparent conductor, such as indium tin oxide, the photoconductive properties of the p-i-n diode structures can be used to an advantage. Since the p-i-n diodes have Photovoltaic characteristics, the diode matrix can be used as a data input terminal by, for example, shining light onto selected diodes. As a result, a detectable change in current will flow through selected respective pairs of the first and second address lines. This change in current, after detection, can be used for data input purposes.

Referring now to FIG. 8, it illustrates an electronic matrix array 50 which can be a ROM, PROM or EEPROM array, or, depending on intended use, a field programmable logic array in accordance with the present invention. The electronic matrix array 50 of FIG. 8 utilizes the diode matrix of FIG. 1 to facilitate individual selection or addressing of the memory cells of the devices. As a result, the elements which this array 50 have in common with the array 30 of FIG. 1 have been assigned corresponding reference numerals.

More particularly the array includes a first plurality of address lines 32, a second plurality of address lines 34, and a plurality of selection devices or diodes 36, one at each crossover point of the first and second address lines 32 and 34. In addition, the array 50 includes a layer 52 of settable or resettable material between the diodes 36 and one of the plurality of address lines, here, the second plurality of address lines 34. Lastly, the channels or grooves 38 and non-conducting regions 39 are provided to provide the previously mentioned additional electrical isolation.

As will be described more fully hereinafter, when the layer 52 is formed from a settable material having a normal substantially non-conductive state and a settable substantially non-resettable comparatively high conductive state, the array can be either a ROM, PROM, or field programmable logic array. When the layer 52 is formed from a resettable material having a substantially non-conductive state and a comparatively high conductive state and which is settable and resettable between those states, the array comprises an EEPROM array.

Figure 9A:
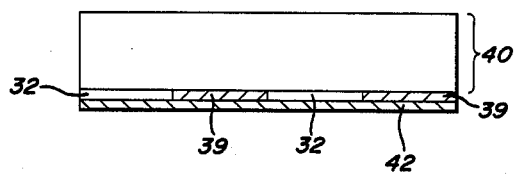
Figure 9B:
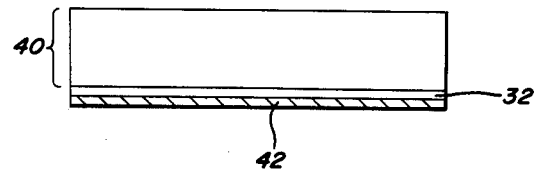
Figure 10A:
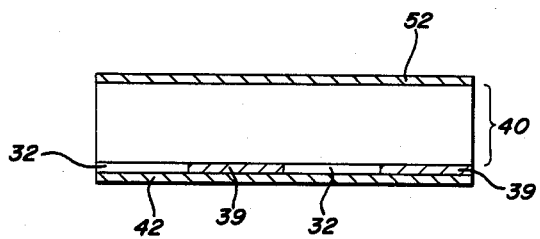
Figure 10B:
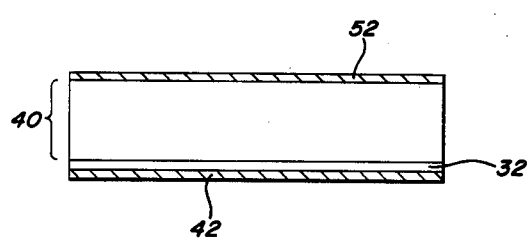
Figure 11A:
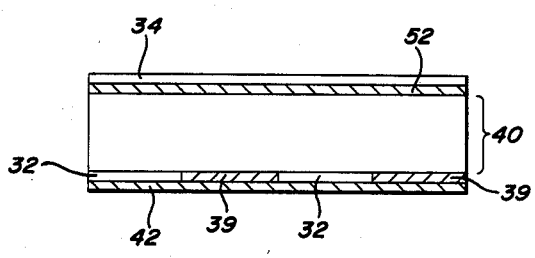
Figure 11B:
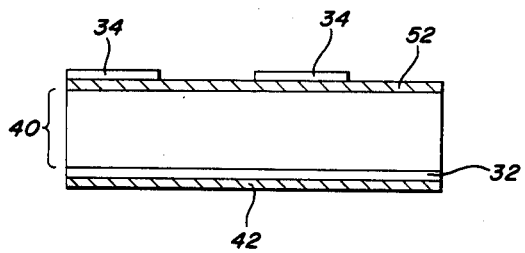
Figure 12A:
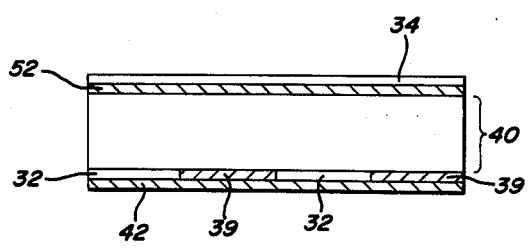
Figure 12B:
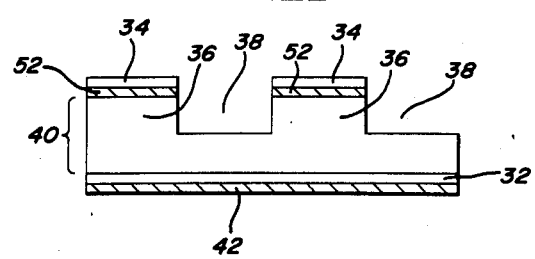

FIGS. 9A through 12B illustrate the manner in which the array 50 of FIG. 8 can be fabricated in accordance with the present invention. FIGS. 9A and 9B show that the diode structure 40 including the first set of address lines 32 is first formed on a non-conductive substrate 42 as previously described. Then, the settable or resettable material 52 is deposited over the diode structure 40 as shown in FIGS. 10A and 10B. The second address lines 34 are then formed over the settable or resettable material 52 in a manner as previously described as shown in FIGS. 11A and 11B. As before, the first and second plurality of address lines are formed so that they cross at an angle to form a plurality of crossover points. Lastly, as shown in FIGS. 12A and 12B, the areas of the amorphous silicon alloy and the settable or resettable material are etched using the address lines as a mask to form the channels or grooves 38 and the diode bodies 36 with the memory material 52 in series therewith.

One preferred settable material from which the layer 52 can be formed is $Si_{50}C_{50}$. A memory cell made of this material is substantially irreversible, i.e., substantially non-resettable. This cell material has a maximum processing temperature of up to 500° C. and a maximum storage temperature of from 200° C. up to approximately 400° C. Devices made from this material can have a threshold voltage of eight volts. The SET resistance can be less than 500 ohms and an OFF resistance of up to $10^6$ ohms.

Silicon alloys produced by glow discharge or plasma deposition technique, have properties and characteristics similar to those of the $Si_{50}C_{50}$ material. One such material is a silicon oxygen material wherein the silicon is 95 to 100 atomic percent and the oxygen is from 5 to 0 atomic percent with one preferred material being $Si_{95}O_5$. Other materials or alloys can be formed from compound gases such as silane, silicon tetrafluoride and hydrogen.

In forming the layer 52, the amorphous phase change materials are deposited onto the diode structure 40 to the desired thickness. The deposition techniques can be those described in the above referenced U.S. Pat. Nos. 4,217,374 and 4,226,898. One exemplary deposition process is a plasma deposition from $SiH_4$ which can include a diluent such as argon gas in about a one to one ratio. During the deposition, the substrate 42 is heated to about or less than 150° centigrade.

Between 500 and 2000 angstroms of settable material is deposited at an operating frequency of about 30 kilohertz, with about 800 angstroms producing a threshold voltage of eight volts. Varying the thickness of the layer 52 varies the threshold voltage required to set the phase change material into the conductive state. The silicon material described essentially can not be reset.

The materials or alloys described above provide cell or memory region materials which have a stable, highly conductive state and a stable, highly non-conductive state. The non-conductive state is substantially non-resettably switchable into the stable, highly conductive state by applying a current limited voltage pulse or a voltage limited current pulse across the cell region exceeding a predetermined threshold level. The cell remains in the highly conductive state even in the absence of an applied voltage or current and under all operating conditions.

When the layer 52 is a resettable material, the memory material comprises a reversible, phase change material which can be set in a highly conductive state or a highly non-conductive state. More specifically, the layer 52 is formed of a material which is initially amorphous and which can be changed by a set voltage and current to a crystalline conductive state and then reset by a reset voltage and current to an amorphous insulator state. One preferred material from which the resettable material can be made includes germanium and tellurium such as $Ge_{20}Te_{80}$. This material has a good reversibility of up to $10^6$ cycles, a maximum storage temperature of 100° C., a threshold voltage of 8 volts, a SET resistance of 300 ohms and OFF resistance (at 175° C.) of approximately $10^4$ ohms. When such a material is used, a thin barrier layer of molybdenum can first be deposited by evaporation, for example, over the diode structure 40 to prevent migration.

As previously mentioned, when a settable material is used to form layer 52, a ROM or PROM device results. Selected individual memory cells can be set by applying the required threshold voltage and current to selective respective pairs of the first and second address lines. Once set, a memory cell cannot be reset. As a result, when a settable material is used, a PROM array results when the ultimate user does the programming, or a ROM array results if the array is programmed prior to receipt by the ultimate user.

When a resettable material is used for layer 52, an EEPROM array results. Such arrays, after once being programmed, can be reprogrammed.

The array 50 of FIG. 8 can also be used as a field programmable logic array. Preferably the array 50 is used to that end when a settable material is used for layer 52. With or without a layer 52 of resettable or settable material the diodes themselves can be fused to form a bilaterally conducting via or open circuited as required. The diodes can be fused to form a conducting via for example by applying a large current to a selected pair of address lines to locally heat that diode to a temperature in excess of the crystallization temperature. This is electrically programming the conducting via. A selected diode can be open circuited by passing an even larger current through the pair of address lines associated with that diode. This current should be sufficient to locally heat the amorphous silicon alloys forming the diode to a temperature which locally vaporizes the material to open circuit the same. As a result, field programmable logic arrays can also be obtained in accordance with the present invention.

Figure 13:
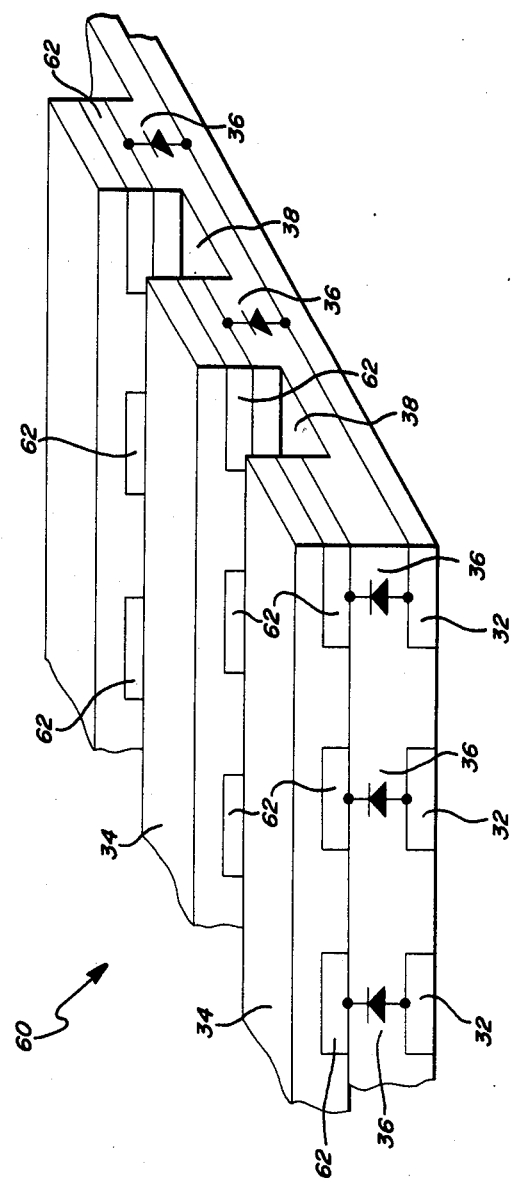
FIG. 13 is a partial perspective view of another electronic matrix array embodying the present invention.

Referring now to FIG. 13, it illustrates another electronic matrix array 60 embodying the present invention which can be a ROM, PROM, or EEPROM array or a field programmable logic array depending on the memory material used and the manner of programming the memory cells and diodes. The array 60 includes a first plurality of address lines 32, a second plurality of address lines 34, and a plurality of diodes 36 at the crossover points of the address lines 32 and 34. The array 60 also includes a plurality of discrete layers 62 of settable or resettable material within the areas defined by the crossover points.

Figure 14A:
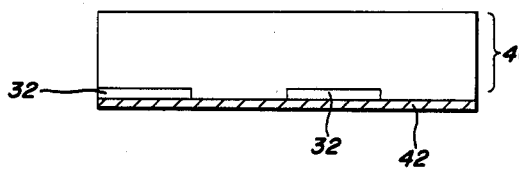
Figure 14B:
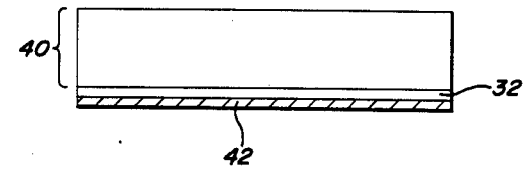
Figure 15A:
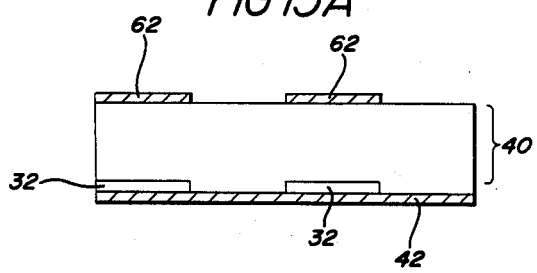
Figure 15B:
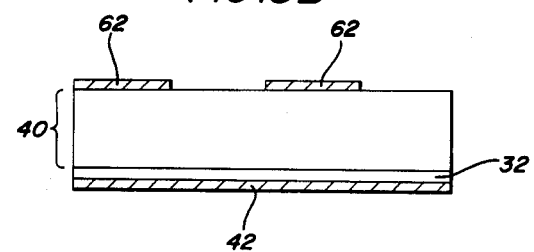
Figure 16A:
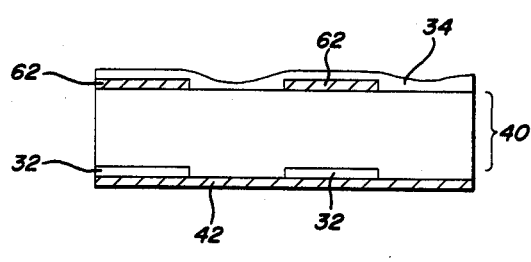
Figure 16B:
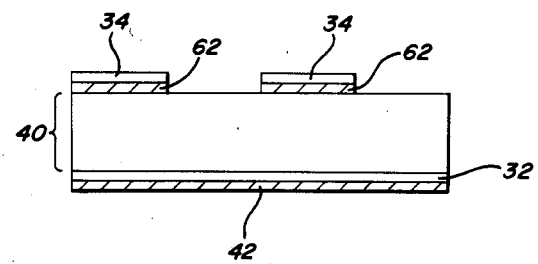

The method of fabricating the array 60 is shown in FIGS. 14 through 16. First, the diode structure 40, preferably of a p-i-n configuration is formed atop the substrate 42 having address lines 32 deposited thereon, or diffused therein in a manner as previously described. Then, as shown in FIGS. 15A and 15B, the memory material is deposited in discrete layers 62 in those areas which will later be within the areas defined by the crossover points. This can be done, for example, by conventional masking and photolithography techniques. Then, as shown in FIGS. 16A and 16B, the second plurality of address lines 34 is formed over the discrete layers of memory material 62 and diode structure 40.

If additional electrical isolation is desired, the areas of the amorphous silicon alloys left exposed can either be etched as previously described or can be oxidized as previously described. This leaves oxidized area to provide increased electrical isolation between the diodes 36.

By using the distributed diode array and the fabrication techniques previously described, a flat panel display can be fabricated with the additional technique of forming top conductors in a desired shape to form display electrodes. FIG. 17 illustrates a horizontal liquid crystal cell structure 70 of that type. It is to be understood that FIG. 17 shows only one such cell and that many such cells can be made with it to form a flat panel display.

The cell 70 includes top conductors 72 and 74, bottom conductors 76, 78 and 80, a plurality of diode bodies 82, 84, 86, 88, 90 and 92, and a pair of display electrodes 94 and 96, electrode 94 being directly over diode bodies 86 and 88 and electrode 96 being formed over conductor 72. As can be seen in the figure, the top conductors 72 and 74 are substantially parallel. They cross the bottom conductors 76, 78 and 80 and are spaced therefrom to form a plurality of crossover points. Within these crossover points and between the conductors are the diode bodies 82, 84, 90 and 92. The electrode 94 also crosses conductors 78 and 80 to form a pair of crossover points wherein diode bodies 86 and 88 are located. The diodes 82, 90, and 92 are open circuited and the diode body 88 is fused to a high conductivity state. Diodes 84 and 86 have been left to function as diodes.

Although, not shown so as to not unduly confuse the figure, a light influencing material, such as a liquid crystal material, is included between the electrodes 94 and 96. By the term "light influencing material" is meant any material which emits light or can be used to selectively vary the intensity, phase, or polarization of light either being reflected from or transmitted through the material. Liquid crystal material is only one such material having these characteristics. In order to set the liquid crystal, conductors 72 and 80 are energized. To reset the liquid crystal, conductors 72 and 74 are energized.

The structure of FIG. 17 can be fabricated by starting with the selection means or diode structure deposited onto a substrate as shown, for example, in FIGS. 14A and 14B. Thereafter, the top conductors and electrodes are deposited onto the diode structure in the configuration as shown. Thereafter, the substrate is etched to form the bottom conductors 76, 78, and 80. Then, the areas of amorphous silicon left exposed by the conductors and electrodes are etched using the conductors and electrodes as a mask. Diodes 82, 90 and 92 are then open circuited by passing a current therethrough sufficient to vaporize the material forming the diodes and diode body 88 is fused. Lastly, the liquid crystal material is introduced between the electrodes 94 and 96. A schematic diagram of the display cell 70 is shown in FIG. 17A.

It may be desired to fill the open areas between the diode bodies and the conductors with a potting compound. This would provide added structural integrity for the cell 70.

As can be appreciated, since large area substrate and diode structures can be employed as starting materials, large area flat panel displays can be made in accordance with the present invention. Also, because relatively few lithographic steps need be performed to make the device, small cell size and hence, increased packing density and resolution can be obtained.

FIG. 18 illustrates another flat panel display liquid crystal cell 100 embodying the present invention. This cell is a vertical cell and includes a relatively large area top electrode 102. The cell 100 also includes top conductors 104 and 106 and bottom conductors 108, 110, and 112. Conductors 108 and 110 cross under conductor 104 forming a pair of crossover points having therein diode bodies 116 and 118. Conductors 108 and 110 also pass beneath electrode 102. The juxtaposed surface area of the conductors 108 and 110 with electrode 102 contain therebetween diode bodies 124 and 126. Similarly, conductors 112 and 108 cross under conductor 106 forming another pair of crossover points having diode bodies 128 and 130 therein. Lastly, diode bodies 120 and 122 are between electrode 102 and conductors 108 and 112. As shown in FIG. 18, diode bodies 116 and 130 have been open circuited, diode bodies 118 and 128 fused or short circuited, and diode bodies 124, 126, 120 and 122 remain functional as diodes.

Not shown in the figure for purposes of not unduly complicating the same is the liquid crystal material deposited onto electrode 102 and a transparent conductor overlying the liquid crystal material. The transparent conductor would be coupled to a source of common potential. Diodes 124 and 126 form an AND gate. When the cell is energized, a positive voltage is applied to conductors 104 and 108. To reset the cell, either one of conductors 104 and 108 is coupled to ground potential or a negative voltage.

The cell 100 is fabricated by starting with the deposited diode structure over addressing lines on a substrate as shown, for example, in FIGS. 14A and 14B. Then, the top conductors 104 and 106 and the electrode 102 are deposited on top of the diode structure in the desired configuration as shown. Then, the areas of the amorphous silicon diode structure left exposed by the conductors and electrodes are etched to form the diode bodies. Thereafter, diodes 116 and 130 are open circuited by passing a current through the diodes sufficient to vaporize localized regions of the amorphous silicon forming the diodes to open circuit the same. Diode bodies 118 and 128 are short circuited by passing a current therethrough sufficient to heat the amorphous silicon alloys forming the diode bodies to a temperature which crystallized the material. Lastly, the liquid crystal material is applied over the electrode 102 and the common electrode is applied over the electrode 102 and the liquid crystal material. The open spaces beneath the cell can be potted with a potting compound to increase the physical integrity of the cell if desired. Again, it should be understood that many such cells can be processed simultaneously on a single large area substrate and that just one such cell has been shown and described herein for purposes of illustration. A schematic diagram of the cell 100 is shown in FIG. 18A.

Many modifications and variations of the present invention are possible in light of the above teachings. For example, the amorphous silicon diode bodies can have numerous sizes and shapes and can also have an n-i-p configuration. Also, multiple p-i-n structures can be deposited in tandem to form multiple diode structures. When several layers of conductors are deposited, each separated by a layer of thin film semiconductor material, a multi-level structure is formed with many levels of electrically interconnectable programmable diode cells. Multiple diode structures would be desired for some operating voltage and current requirements and multi-level structures are desired for maximum gate or bit density and minimum interconnecting circuit lengths. By the term "amorphous" is meant an alloy or material which has long range disorder, although it can have short or intermediate order or even contain at times crystalline inclusions. It is therefore, to be understood that within the scope of the appended claims the invention can be practiced otherwise than as specifically described.

What is claimed and desired to be secured by Letters Patent of the United States is:

1. A method of forming an electronic matrix array atop a non-conductive surface formed of a non-conductive material comprising:
    forming a first set of parallel, spaced apart address lines on the non-conductive surface, the address lines being electrically isolated from one another;
    depositing a plurality of continuous layers of semiconductor materials directly atop the non-conductive surface and the first address lines to form a continuous, selection means structure over the non-conductive surface and the first address lines; and
    forming a second set of parallel, spaced apart address lines on the continuous selection means structure on the side thereof opposite the non-conductive surface and the first set of address lines with said second set of address lines crossing said first set of address lines at an angle for forming a plurality of crossover points therewith through which selected current paths can be established between respective address lines of said first and second sets of address lines.

2. The method of claim 1 further comprising converting a portion of the non-conductive surface to a conductive form whereby to form said first set of address lines with interleaved regions of non-conductive material therebetween.

3. The method of claim 2 wherein the non-conductive surface is a deposited amorphous semiconductor material and the first set of address lines are formed by the addition of high populations of majority charge carriers, therein.

4. The method of claim 2 wherein the non-conductibe surface is a deposited amorphous semiconductor material and the first set of address lines are formed by the addition of a conductivity enhancing additive thereto.

5. The method of claim 4 wherein the conductivity enhancing additive is aluminum.

6. The method of claim 1 comprising depositing a conductive material on the non-conductive surface, and converting a portion of the conductive material to a non-conductive form whereby to form non-conductive regions interleaved with said first set of address lines therein.

7. The method of claim 6 wherein the conductive material is a deposited, amorphous semiconductor material, and the non-conductive form is an oxide thereof.

8. The method of claim 6 wherein the conductive material is aluminum, and the non-conductive form is aluminum oxide.

9. The method of claim 1 wherein the non-conductive surface is a non-conductive film on a conductive substrate.

10. The method of claim 1 wherein the non-conductive surface is a surface of a non-conductive substrate.

11. The method of claim 1 wherein said semiconductor materials comprise amorphous semiconductor alloys.

12. A method of making an electronic circuit comprising:
    providing a non-conductive substrate surface;
    depositing on said substrate surface a continuous layer of material convertible from an initially deposited substantially non-conductive state to a relatively high conductive state in response to the impingement of radiation thereon;
    exposing selected portions of said layer of convertible material to radiation to convert said selected portions to said relatively high conductive state to form a first set of interconnect lines;
    depositing a plurality of layers of semiconductor material directly atop said layer of convertible material to form an array of semiconductor devices in contact with said first set of interconnect lines; and
    forming a second set of interconnect lines over said layers of semiconductor material in contact with said devices on the side thereof opposite said first set of interconnect lines.

13. A method as defined in claim 12 wherein said radiation is coherent radiation.

14. A method as defined in claim 12 wherein said step of depositing said layers of semiconductor material includes depositing said layers of semiconductor material as continuous layers.

15. A method as defined in claim 12 wherein said exposing step includes exposing said selected areas in substantially parallel strips to form said first set of interconnect lines as a first set of substantially parallel conductive address lines interleaved with material in said substantially non-conductive state.

16. A method as defined in claim 15 wherein said step of forming said second set of interconnect lines includes forming said second set of interconnect lines in substantially parallel relation and at an angle to said first set of address lines to form a second set of address lines which form a plurality of crossover points with said first set of address lines.

* * * * *